(12) United States Patent
Downs et al.

(10) Patent No.: US 7,181,704 B1
(45) Date of Patent: Feb. 20, 2007

(54) METHOD AND SYSTEM FOR DESIGNING INTEGRATED CIRCUITS USING IMPLEMENTATION DIRECTIVES

(75) Inventors: Daniel J. Downs, Longmont, CO (US); Raymond Kong, San Francisco, CA (US); John J. Laurence, Westminster, CO (US); Sankaranarayanan Srinivasan, Boulder, CO (US); Richard Yachyang Sun, Mountain View, CA (US)

(73) Assignee: Xilinx, Inc., San Jose, CA (US)

( * ) Notice: Subject to any disclaimer, the term of this patent is extended or adjusted under 35 U.S.C. 154(b) by 225 days.

(21) Appl. No.: 10/913,746

(22) Filed: Aug. 6, 2004

(51) Int. Cl.
  *G06F 17/50* (2006.01)

(52) U.S. Cl. .................. 716/3; 716/4; 716/11; 716/17; 716/18

(58) Field of Classification Search .................. 716/4, 716/11, 17, 18
See application file for complete search history.

(56) References Cited

U.S. PATENT DOCUMENTS

| 5,867,396 | A | 2/1999 | Parlour | |
|---|---|---|---|---|
| 6,490,717 | B1 * | 12/2002 | Pedersen et al. | 716/18 |
| 6,539,533 | B1 * | 3/2003 | Brown et al. | 716/17 |
| 6,574,788 | B1 * | 6/2003 | Levine et al. | 716/18 |
| 2002/0016952 | A1 * | 2/2002 | Chang et al. | 716/18 |
| 2004/0098689 | A1 * | 5/2004 | Weed | 716/11 |
| 2004/0225972 | A1 * | 11/2004 | Oeltjen et al. | 716/4 |
| 2005/0114818 | A1 * | 5/2005 | Khakzadi et al. | 716/11 |
| 2005/0149898 | A1 * | 7/2005 | Hakewill et al. | 716/18 |

OTHER PUBLICATIONS

U.S. Appl. No. 10/273,448, filed Oct. 17, 2002, Anderson.
U.S. Appl. No. 10/812,550, filed Mar. 29, 2004, Aggarwal et al.
U.S. Appl. No. 10/912,957, filed Aug. 6, 2004, Laurence et al.
U.S. Appl. No. 10/912,999, filed Aug. 6, 2004, Sun et al.
U.S. Appl. No. 10/913,000, filed Aug. 6, 2004, Kong et al.
U.S. Appl. No. 10/913,752, filed Aug. 6, 2004, Downs et al.
"Development System Reference Guide" from Xilinx Inc., 2100 Logic Drive, San Jose, CA. 95124, Copyright 1994-2003, which has Web address http://toolbox.xilinx.com/docsan/xilinx6/books/data/docs/dev/dev0001_1.html.
"Constraints Guide", ISE 6.1i from Xilinx Inc., 2100 Logic Drive, San Jose, CA. 95124, Copyright 1994-2003, which has Web address http://toolbox.xilinx.com/docsan/xilinx6/books/data/docs/cgd/cgd0001_1.html).

* cited by examiner

*Primary Examiner*—Jack Chiang
(74) *Attorney, Agent, or Firm*—Pablo Meles; LeRoy D. Maunu

(57) ABSTRACT

A method of designing an integrated circuit using implementation directives for flow control can include the step of loading a design along with specified constraints, creating at least one instance of an data structure formed from a partial netlist, and decomposing at least one set of high level rules into simple implementation directives. The method can further include the steps of selectively attaching the simple implementation directives to the data structure, implementing a task manager which queries a data structure node to create a list of tasks to be performed on the data structure, and executing the list of tasks using a generic flow engine.

14 Claims, 3 Drawing Sheets

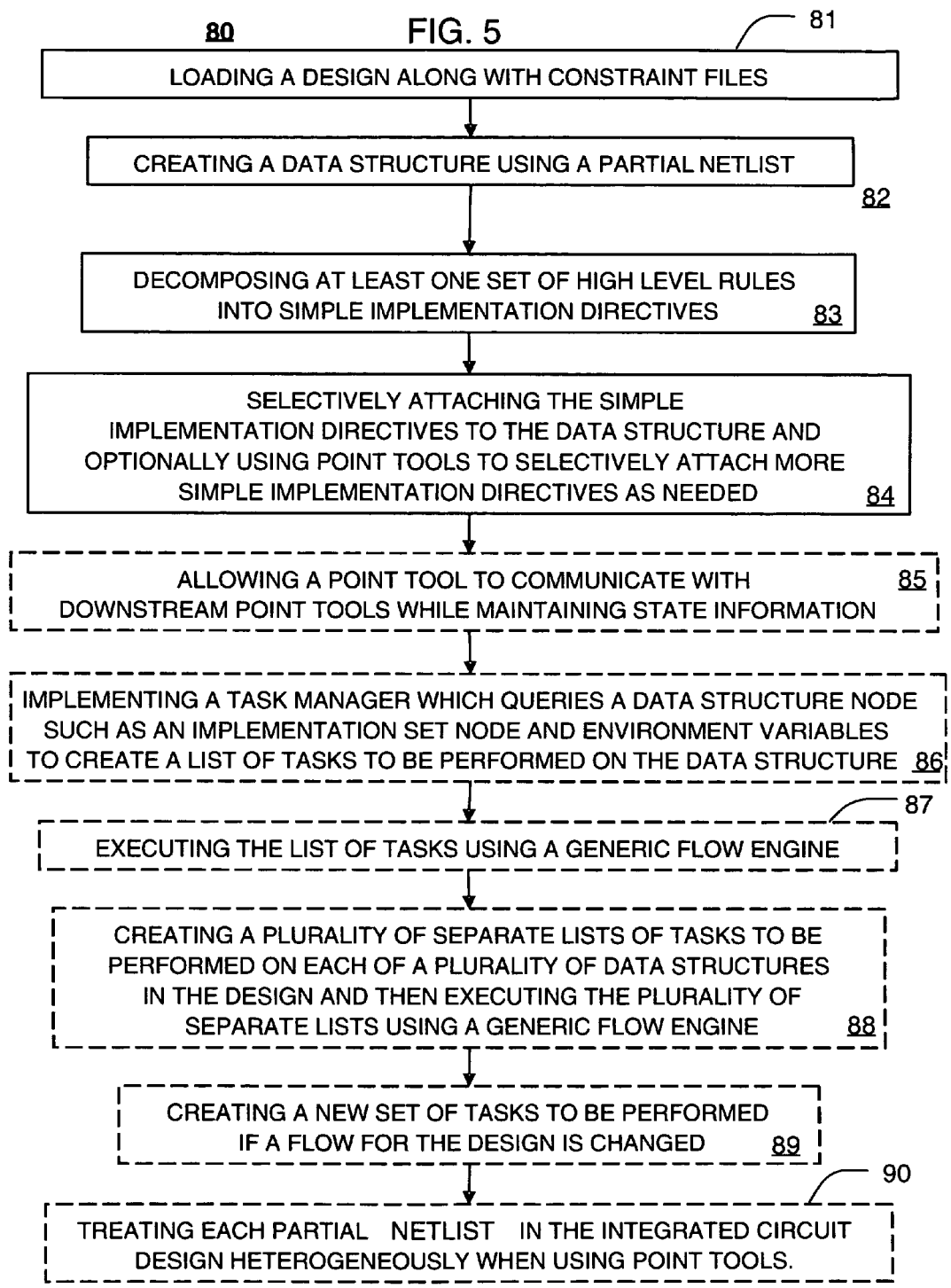

METHOD AND SYSTEM FOR DESIGNING INTEGRATED CIRCUITS USING IMPLEMENTATION DIRECTIVES

CROSS-REFERENCE TO RELATED APPLICATIONS

The following applications, commonly assigned and filed concurrently herewith, are hereby incorporated by reference:

1. METHOD AND SYSTEM FOR IMPLEMENTING A CIRCUIT DESIGN IN A TREE REPRESENTATION, Ser. No. 10/912,999, filed on Aug. 6, 2004, by Richard Y. Sun et al.

2. METHOD AND SYSTEM FOR MANAGING BEHAVIOR OF ALGORITHMS, Ser. No. 10/913,752, filed on Aug. 6, 2004, by Daniel J. Downs et al.

3. METHOD AND ARRANGEMENT PROVIDING FOR IMPLEMENTATION GRANULARITY USING IMPLEMENTATION SETS, Ser. No. 10/913,000, filed on Aug. 6, 2004, by Raymond Kong et al.

4. IMPLEMENTATION SET-BASED GUIDE ENGINE AND METHOD OF IMPLEMENTING A CIRCUIT DESIGN, Ser. No. 10/912,957, filed on Aug. 6, 2004, by John J. Laurence et al.

BACKGROUND

1. Field of the Invention

The invention relates to the field of circuit design and, more particularly, to the use of implementation directives in implementing a circuit design.

2. Description of the Related Art

Circuit designs, and particularly designs for Field Programmable Gate Arrays (FPGA's), have become increasingly complex and heterogeneous. Modern circuit designs can include a variety of different components or resources including, but not limited to, registers, block Random Access Memory (RAM), multipliers, processors, and the like. This increasing complexity makes design tools, maintenance of design tools as well as placement and signal routing of circuit designs more cumbersome. Existing design tools can have multiple (and complex) flows that fail to be uniform, further adding to the complexity in the tools and their maintenance. Furthermore, existing design tools fail to provide sufficient flexibility in terms of representing design granularity in a particular design.

Many of the tasks performed in these flows relate to working with containers of grouped logic. Flows are determined in part by user specified command line parameters and constraint files. Point tools read the parameters from the command line and constraint files, and operate on the groups of logic with algorithms that are dependent on the particular flow that is being followed. The algorithms are fractured and branch into other algorithms depending on characteristics such as the flow information and the additional parameters that define the grouped logic. Note, changes to the flow definition may require extensive modification to underlying algorithms.

In existing systems, individual point tools would use flow information to change the behavior of algorithms. For example, a tool may need to know if it should use results from a previous implementation (guide) when placing and routing a container of logic. The tool would determine the flow, and perhaps not guide the container if it had a change to the logic and it was in an incremental design flow. In other words, flow information was interspersed widely throughout the point tools' algorithms. For instance, in a modular design flow, Place and Route tools read data from the command line, but the existence of a previously implemented module in the design database would invoke a different algorithm than was originally being processed. The distributed nature of flow information throughout the algorithms has many disadvantages. A specified flow is a very high level concept that affects many low-level decisions. Any changes to the high-level flow information will result in changes to the code in many different places that can result in costly coding errors. Relatively minor changes to the flow can result in major modifications to the underlying algorithms. Consequently, it is difficult to support new flows or modify existing flows. A software paradigm fails to exist that simplifies and manages a multitude of flows or complex flows supported by an application or an algorithm.

SUMMARY OF THE INVENTION

Embodiments in accordance with the present invention provide a method, system, and apparatus for performing circuit design using low-level, flow independent tasks. More particularly, an exemplary embodiment of the present invention involves a method of designing an integrated circuit including the steps of interpreting high-level flow data from a command line, constraint files, and environment variables to create a data model and augmenting the data model with a plurality of directives allowing for flow independent tasks. The method can further include the steps of associating at least some of the plurality of directives with a partial netlist among a group of partial netlists, creating a list of tasks based upon the plurality of directives associated with the partial netlist, and associating a set of tasks that operate on logic represented by the partial netlist. Note that each partial netlist can form a container and that the method can further include the step of calling the tasks for each container.

In another embodiment of the present invention a method of designing an integrated circuit using implementation directives for flow control can include the step of loading a design along with constraint files, creating at least one instance of a data structure formed from a partial netlist, and decomposing at least one set of high level rules into simple implementation directives. The method can further include the steps of selectively attaching the simple implementation directives to the data structure.

In yet another embodiment of the present invention, a design tool for designing integrated circuits using implementation directives for flow control can include an interpreter for interpreting flow data from at least one among a command line, constraint files, and environment variables to form a data model, a decomposer for decomposing the flow data into directives, and a task manager for creating a set of tasks associated with each of the plurality of partial netlists that operate on the logic of the partial netlists. The design tool can further include a generic flow engine for calling the tasks for each of the plurality of partial netlists. Note, the directives can be individually associated with each of a plurality of partial netlists forming a design.

Other embodiments of the present invention, when configured in accordance with the inventive arrangements disclosed herein, can include a system for performing, and a machine-readable storage for causing a machine to perform, the various processes disclosed herein.

BRIEF DESCRIPTION OF THE DRAWINGS

There are shown in the drawings, embodiments which are presently preferred, it being understood, however, that the invention is not limited to the precise arrangements and instrumentalities shown.

FIG. 5 is a flow chart illustrating a method of implementing an integrated circuit design in accordance with another embodiment of the inventive arrangements disclosed herein.

DETAILED DESCRIPTION OF THE INVENTION

Embodiments in accordance with the present invention provide for a new software paradigm that simplifies and manages complex and multiple flows supported by an application and/or an algorithm. Accordingly, a software flow can be decomposed into a set of smaller, well-defined, flow independent directives that are used to control specific behaviors of an application and/or algorithm. Each directive can affect the implementation of an entire input FPGA design or a portion or portions of an input FPGA design. The notion of an implementation directive is being introduced to provide a common and singular paradigm for which all interactive flows can operate upon.

Implementation directives as envisioned in the various embodiments herein can be used with any number of data structures and software flows. An example of a data structure that can take advantage of implementation directives is an Implementation Set (I-Set) as more fully described in concurrently filed, co-pending, commonly assigned U.S. patent application entitled, METHOD AND ARRANGEMENT PROVIDING FOR IMPLEMENTATION GRANULARITY USING IMPLEMENTATION SETS, by Raymond Kong et al., which is incorporated by reference herein. An I-Set along with the directives can exploit the notion of implementation granularity and provide a flow independent concept to how a partial net-list is specified. In other words, embodiments in accordance with the invention removes dependencies between high-level flow requirements and low-level tasks as it relates to the electronic design process for integrated circuits. By providing a unifying data model such as I-Set, client applications (such as design tools) can significantly simplify their interface to the underlying net-list information. Effectively, client applications no longer need to distinguish between different net-list entities such as user floor planned partitioning (e.g., area groups), modules, and flat designs in its implementation. Client applications such as design implementation tools can focus solely on I-Sets and basic implementation directives can be decomposed from high-level flow information and be associated with partial net-lists. A software tool can be used to determine a list of (flow independent) tasks needed to manipulate the containers.

Embodiments of the present invention provide a solution for simplifying the implementation of circuit designs and associated maintenance without limiting or restricting granularity by using an abstraction called implementation sets or I-Sets along with directives. Note, however, that implementation directives can be used effectively with data structures other than I-Sets.

Figure 1:
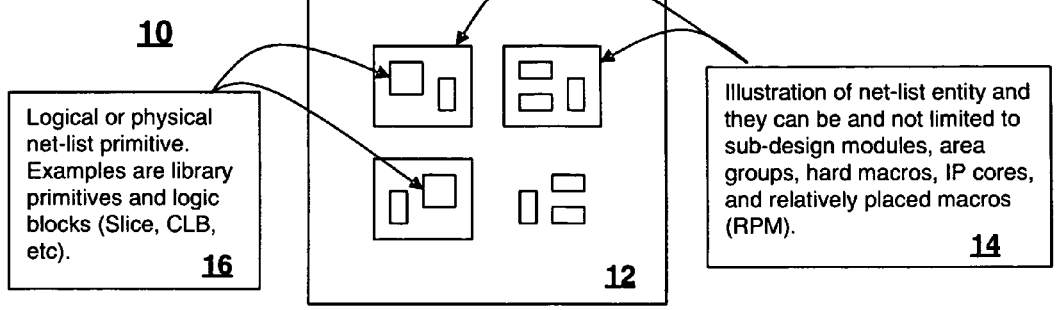
FIG. 1 is a sample design illustrating net-list entities and logical or physical net-list primitives in accordance with one embodiment of the inventive arrangements disclosed herein.

Circuit designs or circuit design representations can include any physical description of a circuit design in terms of the components to be used, including but not limited to, net-lists, circuit descriptions conforming to open standards such as the Berkeley Logic Interchange Format (BLIF), as well as circuit descriptions conforming to proprietary standards such as Native Circuit Description as used by Xilinx, Inc. of San Jose, Calif. For example, as shown in FIG. 1, a sample circuit design representation 10 can include a circuit design 12 having a plurality of net-list entities 14 such as sub-design modules, user floor partitioning (e.g., area groups), hard macros, IP cores, and relatively placed macros each having logical or physical net-list primitives 16 such as library primitives and logic blocks such as slices and configurable logic blocks (CLBs). For simplicity, user floor partitioning or Area Groups, Active Modules, Inactive Modules, PIMs, hard macros, soft IP cores, and RPMs will be collectively referred to hereinafter as net-list entities or partial netlists.

The methods disclosed herein can be implemented by a software-based circuit design tool that can receive, pack, place, and route a circuit design representation. As is known, placing refers to assigning components of a circuit design to physical locations on a chip and routing refers to routing signals, or forming connections, between components of the circuit design.

Figure 2:
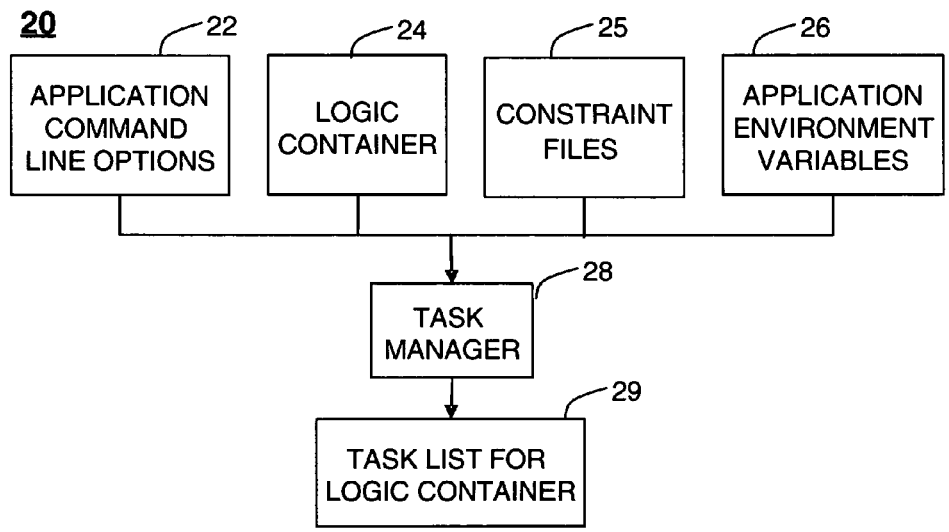
FIG. 2 is a flow chart illustrating how tasks can be created in accordance with one embodiment of the inventive arrangements disclosed herein.
Figure 3:
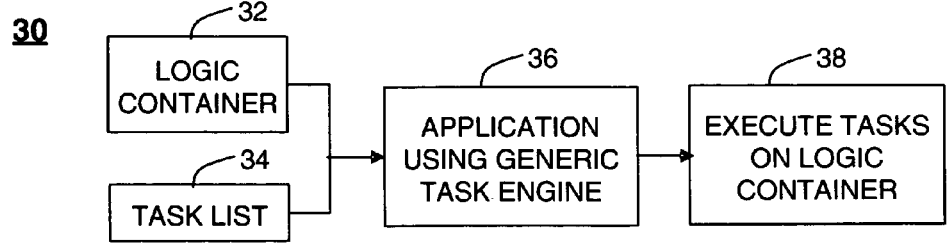
FIG. 3 is a flow chart illustrating how implementation directives can be used in accordance with one embodiment of the inventive arrangements disclosed herein.

Referring to FIGS. 2 and 3, high level views in the form of flow charts 20 and 30 illustrates how implementation directives are created and used respectively in accordance with embodiments of the invention. An input FPGA design is typically loaded along with specified constraints that can be contained in constraint files 25. A data structure can be created using a partial netlist that can define a logic container 24 for example. A task manager 28 can query a data structure including the logic container 24, the constraint files 25 as well as application command line options 22 and application environment variables 26 to create a list of tasks 29 to be performed on the data structure. Examples of environment variables include: XIL_GUIDE_MEMORY_BLOCKS= [TRUE|FALSE], if TRUE, then a guide task will guide memory blocks and XIL_GUIDE_CONTEXT_LOGIC= [TRUE|FALSE], if TRUE, then a guide task will guide context logic. Referring to FIG. 3, an application can use a generic task engine 36 to query a data structure such as a logic container 32 and a created task list 34 to execute at step 38 the tasks on the logic container.

Figure 4:
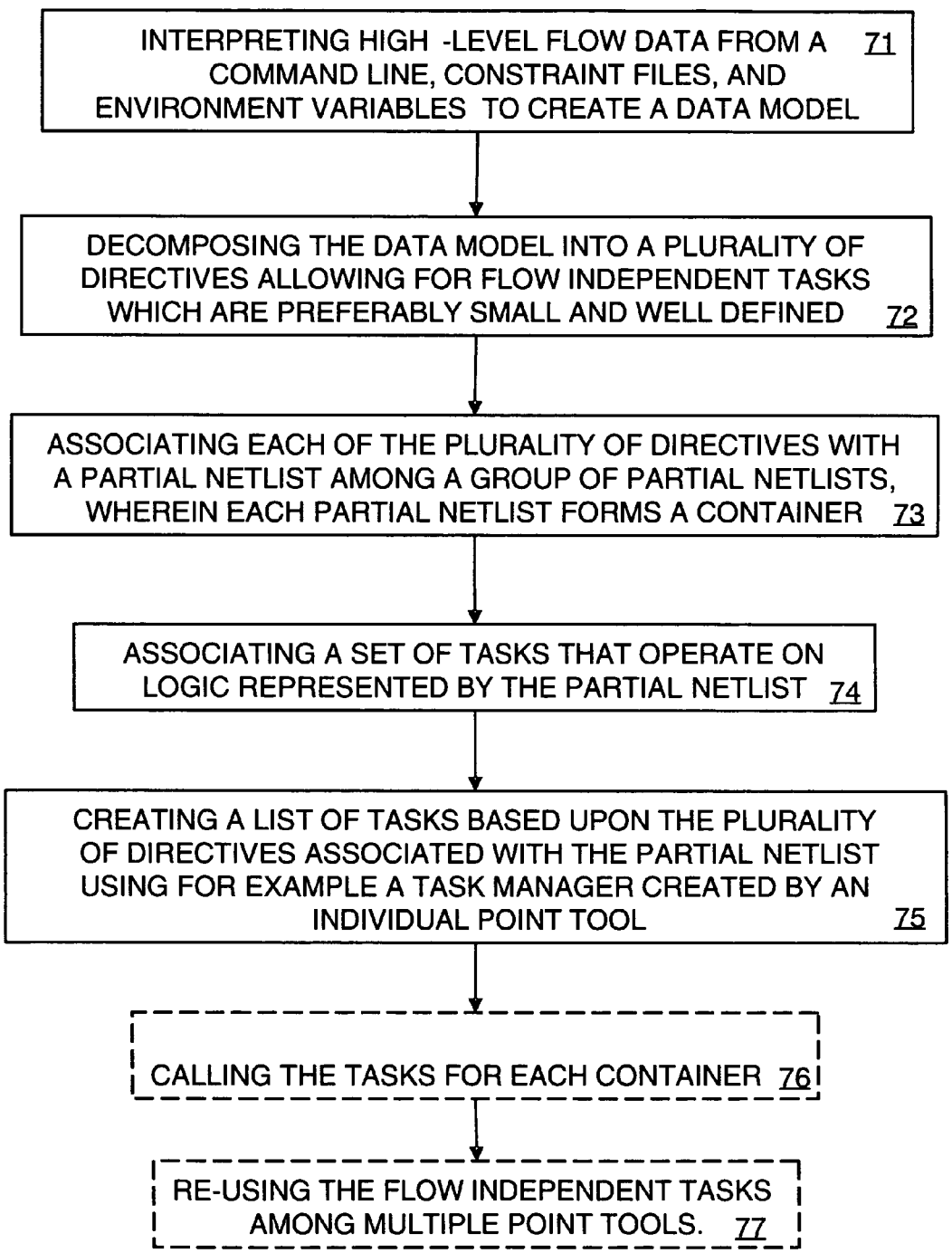
FIG. 4 is a flow chart illustrating a method of implementing an integrated circuit design in accordance with an embodiment of the inventive arrangements disclosed herein.

Referring to FIG. 4, a flow chart illustrating a method 70 of designing a integrated circuit includes the step 71 of interpreting high-level flow data from a command line, constraint files, and environment variables to create a data model and the step 72 of decomposing the data model into a plurality of directives allowing for flow independent tasks. The method 70 can further include the step 73 of associating each of the plurality of directives with a partial netlist among a group of partial netlists, the step 74 of associating a set of tasks that operate on logic represented by the partial netlist, and the step 75 of creating a list of tasks based upon the plurality of directives associated with the partial netlist. The step 75 of creating the list of tasks can be done using for example a task manager created by an individual point tool.

Note that each partial netlist forms a container and that the method 70 can further include the step of calling the tasks for each container at step 76. Optionally, the method 70 can further include the step of re-using the flow independent tasks among multiple point tools at step 77.

Referring to FIG. 5, a flow chart is shown illustrating another method 80 of designing an integrated circuit using implementation directives for flow control. The method 80 can include the steps of loading a design along with constraint files at step 81, creating at least one instance of an data structure formed from a partial netlist at step 82, and decomposing at least one set of high level rules into simple implementation directives at step 83. The method 80 can further include the step 84 of selectively attaching the simple implementation directives to the data structure. Optionally, point tools can be used to selectively attach more simple implementation directives to the data structures as needed.

The method 80 can further include the optional steps of allowing a point tool to communicate with downstream point tools while maintaining state information at step 85 and of implementing a task manager which queries a data structure node such as an implementation set node and environment variables at step 86 to create a list of tasks to be performed on the data structure. The method 80 can then execute the list of tasks optionally using a generic flow engine at step 87. Alternatively, the method 80 can include the step 88 of creating a plurality of separate lists of tasks to be performed on each of a plurality of data structures in the design and then executing the plurality of separate lists using the generic flow engine. A new set of tasks to be performed can be created at step 89 if a flow for the design is changed. Finally note that each partial netlist in the integrated circuit design can be treated heterogeneously when using point tools as noted at step 90.

Referring again to FIG. 2, first, the I-set tree having I-set nodes, is built as described in co-pending, commonly assigned, and concurrently filed patent application entitled, METHOD AND ARRANGEMENT PROVIDING FOR IMPLEMENTATION GRANULARITY USING IMPLEMENTATION SETS, by Raymond Kong et al., which is herein incorporated by reference. Then the task manager 28 traverses each I-set node to assign tasks based on information such as command line options, constraint files (UCF), implementation directives, and environment variables.

An example of an implementation directive is: "IST_GUIDE_SIGNALS={TRUE|FALSE}". This directive will perform the task of guiding signals (i.e., re-using signal data from a guide file in a current design), if the directive is TRUE. The following execute functor pseudo code illustrates the task performed:

```
bool BAS_GI_TASK_SIGS::execute(GI_ISET *iset)
{
    // Quick check to make sure we should be guiding the signals
    if( !iset->Check_IST_GUIDE_SIGNALS_DIRECTIVE( ) )
        return TRUE;
    Create new report object;
    For Each Signal
    {
        Align pins;
        Get Corresponding signal from current Design;
        Transfer guide signal data to current design signal;
        Update report object;
    }
    return TRUE if there were no problems, FALSE otherwise;
}
```

In one embodiment directives are pre-defined words that direct the software to operate one way or another. Directives are stored as properties. For example, IST_GUIDE_ALL_OR_NOTHING is a directive that is stored as a property.

A first embodiment of the pseudo code for task assignment by the task manager 28 using design I-Set information is:

```
For each I-Set Node (N) in the design
{
    If (Command line option (O) is specified)
    {
        // Assign default tasks based on application command line options
        Assign to N the task of performing operation D1;
        Assign to N the task of performing operation D2;
        Assign to N the task of performing operation D3;
        . . .
        Assign to N the task of performing operation DN;
    }
    If (there is one or more implementation constraints (from the UCFs) specified on N)
    {
        // Assign relevant implementation constraints on N as needed
        Assign to N the task of performing operation U1;
        Assign to N the task of performing operation U2;
        Assign to N the task of performing operation U3;
        . . .
        Assign to N the task of performing operation UN;
    }
    If (N has implementation directive T1)
    {
        Assign to N the task of performing operation T1;
    }
    . . .
    If (N has implementation directive TN)
    {
        Assign to N the task of performing operation TN;
    }
    If (N has implementation directive, Q1 and Environment Variable (E) is set)
    {
        // Assign overriding operation when appropriate
        Assign to N the task of performing operation E1; // instead of Q1
    }
}
```

A second embodiment of the pseudo code for task assignment by the task manager 28 using specialized I-Set information is:

```
For each I-Set Node (N) in the design
{
    Create and construct client specialized I-Set (S) for N;
    If (Command line option (O) is specified)
    {
        // Assign default tasks based on application command line options
        Assign to S the task of performing operation D1;
        Assign to S the task of performing operation D2;
        Assign to S the task of performing operation D3;
        . . .
        Assign to S the task of performing operation DN;
    }
    If (there is a implementation constraints (U) specified on N)
    {
        // Assign relevant implementation constraints on N as needed
        Assign to S the task of performing operation U1;
        Assign to S the task of performing operation U2;
```

-continued

```
        Assign to S the task of performing operation U3;
        . . .
        Assign to S the task of performing operation UN;
    }
    If (S has implementation directive T1)
    {
        Assign to S the task of performing operation T1;
    }
    . . .
    If (S has implementation directive TN)
    {
        Assign to S the task of performing operation TN;
    }
    If (S has implementation directive, Q1 and Environment
Variable (E) is set)
    {
        // Assign overriding operation when appropriate
        Assign to N the task of performing operation E1; //
instead of Q1
    }
}
```

Yet another embodiment of the pseudo code for task assignment by the task manager 28 using guide file information is:

```
For each I-Set Node (N) in the design
{
    Create a specialized Guide I-Set (M) based on node N;
    Assign Guiding implementation directives to M, via guide
file directive;
    Create generic guide tasks, T;
    For each Guide I-Set (M)
    {
        Assign to M comp and signal name matching task;
        Assign to M signal matching task;
        Assign to M comp assignment task;
        If (routing is guided)
        {
            Assign to M the task of signal assignment;
            Assign to M the task of signal matching based on
comp information;
        }
        If (M has implementation directive equal to
"IST_GUIDE_IF_NO_CHANGE")
        {
            Assign to M the task of incremental guiding;
        }
        If (M has implementation directive equal to
"IST_GUIDE_VCC_GND_NETS")
        {
            Assign to M the task of guiding VCC/GND signal;
        }
        If (M has implementation directive equal to
"IST_IGNORE_PORT_NETS")
        {
            Assign to M the task of ignoring the guiding of
port signals;
        }
        Assign to M the task of actual guiding between input
and guide files task;
    }
}
```

An example of a guide file is a binary Native Circuit Description (NCD) file produced from running an original design through the ISE 6.21 software design tool from Xilinx, Inc. of San Jose, Calif. More particularly the NCD file is the output of the Place and Route portion of the ISE tool. The NCD file is further described in the "Development System Reference Guide," UG000 (v3.5.1) Apr. 30, 2003, from Xilinx, Inc. When the original design is modified, for example, changing a few pieces of logic but leaving the bulk of the design unchanged, the guide file is used in running the modified design through the ISE tool to assist in re-using the results from the previous run when possible.

In other embodiments a guide file is the output of any commercial place and route tool of a previous design. The purpose of the guide file is to allow re-use of unmodified parts of the previous design in the current design.

In one embodiment a primary guide technique is name matching. The method starts with a component ("comp") or signal in the modified design file, and looks for a component or signal in the guide file (the NCD created from the previous, e.g., original design, run through the tools) with the same name. The method then creates a "match" object for use later in the flow to demonstrate that there are two components or signals with the same name. This name matching allows re-use of much of the guide file information (e.g., reuse of some, if not many, partial netlists in the NCD file from the previous design) in the NCD file created from the current modified design file.

The following pseudo-code shows the creation of the match objects in one embodiment of the present invention:

```
if( iset is guideable( ) )
{
    Let gdesign = guide design; // NCD from previous design
    Let cdesign = current design;
    For each I-Set comp in current design
    {
        if( cdesign comp name = gdesign comp name )
        {
            createCompNameMatching( cDesignCompName,
gDesignCompName );
        }
    }
    For each I-Set signal in current design
    {
        if( cdesign signal name = gdesign signal name )
        {
            createSignalNameMatching( cDesignCompName,
gDesignCompName );
        }
    }
}
```

Hence, in one embodiment of the present invention, there is a name checker task for comparing signal and component names in a current design with signal and component names in a guide design or file (NCD file from a previous design) in order to re-use at least one previous design partial netlist.

Referring again to FIG. 3, the generic task engine 36 executes the following pseudo-code in one embodiment:

```
For each I-Set node (N) in the design
{
    For each task (T) on N
    {
        Execute task on N's logic, via blocks and signals;
    }
}
```

When a guide file is used, the generic task engine 36 executes the following pseudo-code in another embodiment:

```
For each current design I-Set node (C) in the design
{
    If (C does not have a previous implementation or a Guide
File I-Set node (G))
    {
        Continue;
    }
For each task (T) on C
    {
        Execute Guide tasks on C's logic, using results from
the previously implemented G;
    }
}
```

A further description on guide I-sets is disclosed in co-pending, commonly assigned, and concurrently filed patent application entitled IMPLEMENTATION SET-BASED GUIDE ENGINE AND METHOD OF IMPLEMENTING A CIRCUIT DESIGN, by John J. Laurence et al., which is herein incorporated by reference.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of designing an integrated circuit, comprising the steps of:
   interpreting high-level flow data from a command line, constraint files, and environment variables to create a data model;
   wherein the data model includes a plurality of partial netlists of a design;
   augmenting the data model with a plurality of directives allowing for flow independent tasks;
   wherein each of the plurality of directives controls selection of one or more tasks, and at least one of the directives is an guiding implementation directive;
   associating one or more of the plurality of directives with one or more of the plurality partial netlists, wherein each partial netlist forms a container;
   creating a list of tasks based upon the plurality of directives associated with the partial netlist;
   wherein each partial netlist that has one or more associated directives has a respective list of one or more tasks, and the list of tasks created for the guiding implementation directive includes a first task that determines whether signal names match between a current version of the partial netlist and a previous version of the partial netlist and a second task that assigns for a matching signal, an implementation of the matching signal from the previous version of the partial netlist to an implementation of the current version of the partial netlist; and
   associating a set of tasks that operate on logic represented by the partial netlist.

2. The method of claim 1, wherein the method further comprises the step of calling the tasks for each container.

3. The method of claim 1, wherein the step of creating the list of tasks is performed by a task manager created by a individual point tool.

4. The method of claim 1, wherein tasks are flow independent.

5. The method of claim 1, wherein the method further comprises the step of re-using the flow independent tasks among multiple point tools.

6. A design tool for designing integrated circuits using implementation directives for flow control, comprising:
   an interpreter for interpreting flow data from at least one among a command line, constraint files, and environment variables to form a data model;
   wherein the data model includes a plurality of partial netlists of a design;
   a decomposer for decomposing the flow data into a plurality of directives, wherein one or more of the directives are individually associated with each of a plurality of partial netlists forming the design;
   wherein each of the plurality of directives controls selection of one or more tasks, and at least one of the directives is an guiding implementation directive;
   a task manager for selectively assigning a set of tasks based on the one or more directives associated with each of the plurality of partial netlists, wherein each task operates on the logic of the partial netlist and
   wherein for the guiding implementation directive the tasks include a first task that determines whether signal names match between a current version of a partial netlist and a previous version of the partial netlist and a second task that assigns for a matching signal, an implementation of the matching signal from the previous version of the partial netlist to an implementation of the current version of the partial netlist.

7. The design tool of claim 6, wherein the design tool further comprises a generic flow engine for calling the tasks for each of the plurality of partial netlists.

8. The design tool of claim 7, wherein the tasks associated with each of the plurality of partial netlists are independent of a flow from the generic flow engine.

9. The design tool of claim 7, wherein the set of tasks comprise small flow independent tasks.

10. The design tool of claim 6, wherein the design tool further comprises a data file used to set default flow implementation directives.

11. The design tool of claim 6, wherein the design tool further enables the re-use of tasks among multiple point tools.

12. The design tool of claim 6, wherein the directives are I-Set directives.

13. The design tool of claim 6, wherein the task manager uses input from a command line, environment variables, and constraint files to assign the tasks.

14. The design tool of claim 6, further comprising a name checker module for comparing signal and component names in a current design with signal and component names in a guide file in order to re-use at least one previous design partial netlist.

* * * * *